United States Patent
Yeo et al.

(10) Patent No.: US 6,710,438 B2
(45) Date of Patent: Mar. 23, 2004

(54) ENHANCED CHIP SCALE PACKAGE FOR WIRE BOND DIES

(75) Inventors: Yong Kee Yeo, Singapore (SG); Navas O.K. Khan, Singapore (SG); Mahadevan K. Iyer, Singapore (SG)

(73) Assignees: Institute of Microelectronics, Singapore Science Park II (SG); Advanced Micro Devices (s) PTE LTD, Singapore (SG); Agilent Technologies Singapore PTE LTD, Singapore (SG); Amkor Technology Inc., West Chester, PA (US); Delphi Automotive Systems Singapore PTE LTD, Singapore (SG); Infineon Technologies (Asia Pacific) PTE LTD, Singapore (SE); Agere Systems Singapore PTE LTD, Singapore (SG); Motorola Electronics PTE LTD, Singapore (SG); Philips Electronics Singapore PTE LTD, Singapore (SG); St Assembly Test Services PTE LTD, Singapore (SG)

( * ) Notice: Subject to any disclaimer, the term of this patent is extended or adjusted under 35 U.S.C. 154(b) by 36 days.

(21) Appl. No.: 10/078,718

(22) Filed: Feb. 19, 2002

(65) Prior Publication Data

US 2003/0155641 A1 Aug. 21, 2003

(30) Foreign Application Priority Data

Nov. 2, 2001 (SG) ......................... 200106786

(51) Int. Cl.⁷ ............................. H01L 23/52

(52) U.S. Cl. ..................... 257/691; 257/773; 257/774; 257/779; 257/780; 257/738

(58) Field of Search ..................... 257/691, 773–774, 257/779–780, 738

(56) References Cited

U.S. PATENT DOCUMENTS

| 5,468,999 A | 11/1995 | Lin et al. |
| 6,380,633 B1 * | 4/2002 | Tsai .......................... 257/778 |
| 2002/0185734 A1 * | 12/2002 | Zhao et al. ................. 257/737 |

FOREIGN PATENT DOCUMENTS

WO     WO 98/48449     10/1998

* cited by examiner

Primary Examiner—David E. Graybill
Assistant Examiner—Luan Thai
(74) Attorney, Agent, or Firm—Coats & Bennett, P.L.L.C.

(57) ABSTRACT

A chip scale package assembly comprises an integrated circuit die wire bonded to a carrier for mounting to a printed circuit board. The carrier comprises top and bottom ground planes thermally and electrically bonded together by a number of grounded thermal vias. The top ground plane completely surrounds the wire bond signal connections made with the die, enhancing signal integrity. The top ground plane covers the die mounting area, providing grounding and heat spreading for the die. The thermal vias are also positioned in the mounting area, and thermally couple the die to the bottom-side ground plane. The bottom ground plane is positioned within a central area around which the signal connections from the top-side are arranged. Ground pads with attached solder balls are positioned within the bottom ground plane and conduct heat transferred from the die into a primary circuit board on which the carrier is mounted.

31 Claims, 6 Drawing Sheets

ENHANCED CHIP SCALE PACKAGE FOR WIRE BOND DIES

BACKGROUND OF THE INVENTION

The present invention generally relates to integrated circuits, and particularly relates to chip scale packaging of wire bonded integrated circuits.

Packaging technology represents an enabling element in the ongoing microelectronics revolution. As integrated circuits have shrunk, so too have the physical packages carrying these devices. Various techniques are used to minimize the physical space required for integrated circuits, and to accommodate the increasingly high number of signal connections associated with dense integrated circuit devices.

Common approaches include various chip-on-glass and chip-on-board technologies. In these, an integrated circuit die is mounted directly on a primary circuit substrate, covered only by a minimal amount of epoxy or resin. While offering certain advantages in high-volume manufacturing environments, integrated circuit devices of this nature place significant challenges on handling and testing.

Other approaches strike a balance between physical size and the practical considerations of handling and testing. So-called "chip scale packages" (CSPs) attempt to provide physical packaging for integrated circuit die without increasing the total physical size substantially beyond that of the actual die. Ideally, such packages remain as small as possible while still providing relatively robust protection for the die itself.

Chip scale packaging techniques may incorporate wire bond technology. With wire bond technology, fine wire bonds taken from signal connection points on the die are arrayed as "flying leads," usually around the perimeter edges of the die. These wire bonds are bonded to corresponding connection points, such as wire bond fingers, on the top surface of a chip carrier on which the die is mounted.

The chip carrier functions much like a printed circuit board, providing a rigid (or sometimes flexible) platform that can be readily handled and more easily mounted to a larger circuit board carrying other electrical or electronic circuits. Essentially, the chip carrier provides practical access to the electrical interconnections of the die it carries.

Typically, the chip carrier comprises a substrate with a top layer providing signal and ground connections for interconnecting with corresponding electrical connections on the die. The carrier's bottom side usually carries corresponding connection points, which may be soldered to corresponding connections on the primary circuit board. Generally, these connection points carry solder balls, allowing the carrier to be reflow soldered to the primary circuit board.

While such CSPs maintain a small overall size, they are not without potential disadvantages. For example, the overall electrical impedance between the die's signal points and corresponding connections on the primary circuit board can be undesirably high, contributing to signal degradation and limiting upper operating frequencies. Also, such CSPs may offer poor thermal conduction between the die and the primary circuit board, thus limiting the amount of power that may be dissipated in the die.

BRIEF SUMMARY OF THE INVENTION

A chip scale package assembly comprises an integrated circuit die wire bonded to a carrier. The carrier provides for electrical interconnection with the die and is suitable for mounting on a primary circuit board. Wire bond fingers on the top of the carrier are arrayed around the die mounting area and provide connection points for the die's bond wires, which points are generally grouped in rows along each edge of the carrier. A ground plane surrounds these groups of connection points and also covers the die mounting area. Thermal vias in the die mounting area electrically and thermally couple the ground plane to a second ground plane on the bottom of the carrier. That ground plane includes ground pads with attached solder balls for connection with the primary circuit board. Similarly, signal vias couple the wire bond fingers to corresponding signal pads on the bottom of the carrier, the pads of which also carry solder balls for attachment to the primary circuit board.

By providing a top-side ground plane covering the die mounting area, die grounding is accomplished through mounting the die in electrical connection with the ground plane. This eliminates the need for using one or more bond wire connections to ground the die. Thus, all bond wires may be dedicated to signal connections. Surrounding the bond wire finger terminations for all of these signal connections with the top-side ground plane enhances signal integrity by minimizing cross-talk and ground loop area. Further, positioning thermal vias in the top-side ground plane generally within the die mounting area provides low thermal and electrical impedance connections between the top and bottom side ground planes. The ground pads with attached solder balls on the bottom side ground plane complete the low thermal and electrical impedance connections between the die and the primary circuit board.

DETAILED DESCRIPTION OF THE INVENTION

Figure 1:
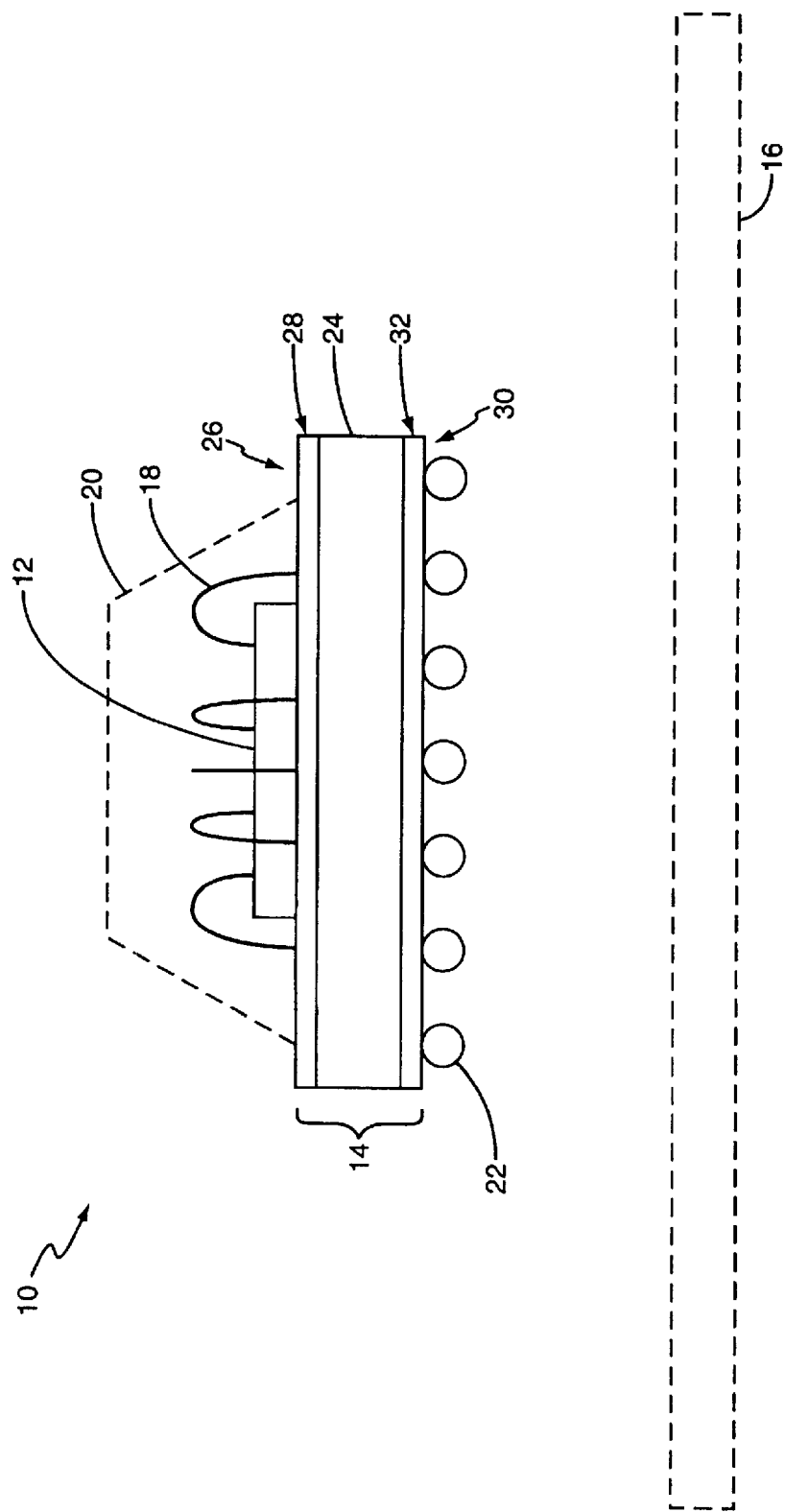
FIG. 1 is a simplified side view of an exemplary chip scale package assembly in accordance with the present invention.

Turning now to the drawings, FIG. 1 illustrates an exemplary embodiment of the chip scale package assembly of the present invention, generally referred to by the numeral 10. The assembly 10 comprises an integrated circuit die 12, and a chip carrier 14. The carrier 14 provides an interface between the die 12 and a primary circuit board 16.

The die 12 may be essentially any type of integrated circuit (IC) die, whether a digital IC, analog IC, or mixed signal IC, and may be implemented in a wide variety of semiconductor process technologies. The die 12 includes a number of electrical connections on its top side (not shown). These connections, typically for signals, are coupled to the carrier 14 using "bond wires" 18, which are arranged as a set of flying leads around the edges of the die 12. The die 12 further includes one or more ground connections on its bottom side, for making ground connection with the carrier 14. The die 12 is mounted to a top side 26 of the carrier 14, and is protected by a mold compound 20 formed over it. The mold compound 20 covers the die 12, sealing the die 12 against the carrier 14, and providing mechanical and environmental protection for the die 12 and its bond wires 18.

The primary circuit board 16 does not comprise a part of the assembly 10, but is typically part of the environment in which the assembly 10 is used. Generally, the board 16 includes one or more circuit devices that are electrically coupled to one or more signals from the die 12, once the assembly 10 is mounted to the board 16. The bottom side 30 of the carrier 14 includes a number of solder balls 22, which allow the assembly 10 to be soldered to the appropriate connections—generally a set of mounting pads—on the board 16. Typically, this mounting process entails subjecting the board 16 with the mounted assembly 10 to a solder "reflow" process that heats the solder balls 22 enough to cause them to melt in a controlled fashion, thereby joining with the mounting pads (not shown) on the primary circuit board 16.

The carrier 14 comprises substrate 24, which may be a rigid resin-base laminate with suitable dielectric, mechanical, and thermal properties, such as bismaleimide triazine (BT), or may be some other material with the appropriate characteristics as needed or desired. The substrate 24 has a top side metal layer 28 disposed on the top side 26 of the carrier 14, and a bottom side metal layer 32 disposed on the bottom side 30 of the carrier 14.

Figure 2:
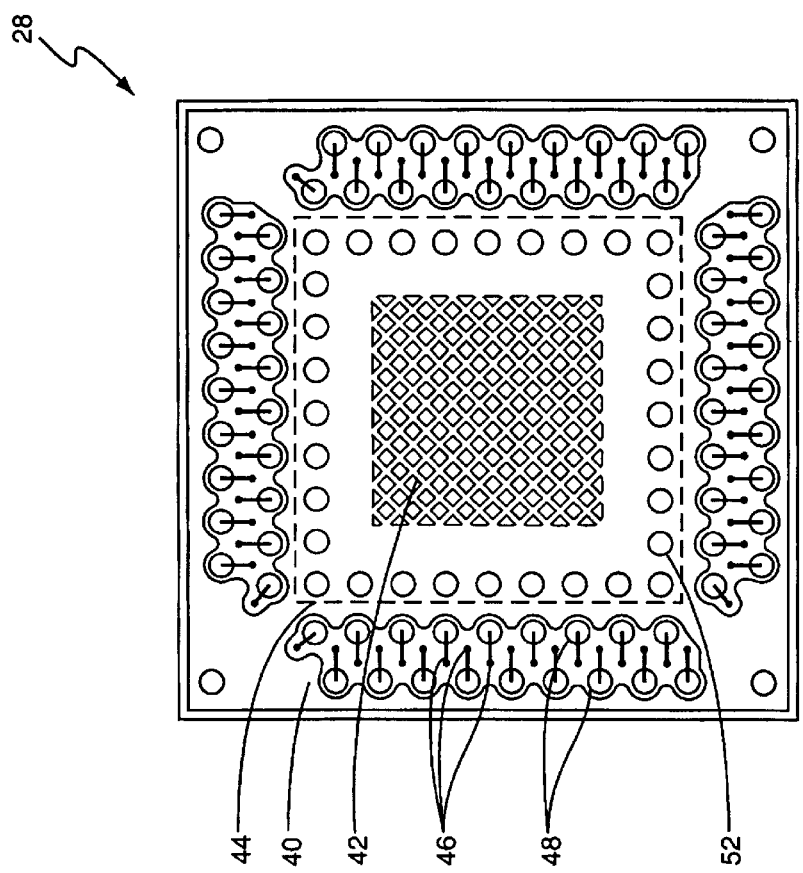
FIG. 2 is diagram of the top metal layer of the carrier shown in FIG. 1.

FIG. 2 illustrates the top-side metal layer 28. A ground plane 40 generally covers the top side of the carrier 14, and includes a hatched portion 42 positioned within a die mounting area 44 on the top side of the carrier 14. A plurality of connection points 46 are arranged into groups generally along each side of the carrier 14. Preferably, these connection points are wire bond fingers 46, which provide a point of attachment for the bond wires 18 from the die 12. The bond wires 18 carrying signals from the die 12 are soldered to or otherwise connected with the wire bond fingers 46. Each wire bond finger 46 has a corresponding signal via 48 that extends through the substrate 24 and provides an electrical connection to a corresponding signal pad (shown later) on the bottom of the carrier 14. The top-side metal layer 28 further comprises a plurality of grounded thermal vias 52.

The ground plane 40 is electrically isolated from the wire bond fingers 46 and the signal vias 48, but completely surrounds each group of wire bond fingers 46 and associated signal vias 48 in the top side metal layer 28. The continuous border formed in the ground plane 40 around each group conforms to the contours defined by the arrangement of fingers 46 and vias 48 within each group. By conforming to these defined contours, the ground plane 40 is maintained in close proximity to the signal interconnections (e.g., bond wire fingers 46) between the carrier 14 and the die 12. Preferably, the ground plane 40 comprises a metallic plane, such as a copper foil for example.

While configuring the ground plane 40 to have a close-proximity, contoured border surrounding all signal connections made on the top side metal layer 28 enhances signal integrity, incorporating the hatched portion 42 within the die mounting area 44 enhances mechanical reliability. Hatching improves reliability for a number reasons, including enhancing the thermal expansion characteristics of the plane 40 in the area immediately beneath the die 12.

The grounded thermal vias 52 also contribute to electrical signal integrity by providing low electrical impedance connections from the top side 26 of the carrier 14 to its bottom side 30. The grounded thermal vias 52 also contribute to the enhanced thermal performance of the assembly 10 by providing thermal conduits beneath the die 12 to the bottom side 30 of the carrier 14. Thermal energy conducted away from the die 12 and down through the thermal vias 52 can be transferred to the primary circuit board 16, which can incorporate heat dissipation features, such such as its own ground planes.

The grounded thermal vias 52 are generally positioned within the die mounting area 44, although the actual die mounting area 44 may be somewhat smaller, in which case the thermal vias 52 would be positioned generally along the perimeter edges of the die 12. In either case, it is expected that the die 12 includes one or more ground connections positioned on its bottom side such that the die 12 is electrically grounded once mounted in contact with the ground plane 40.

Figure 3:
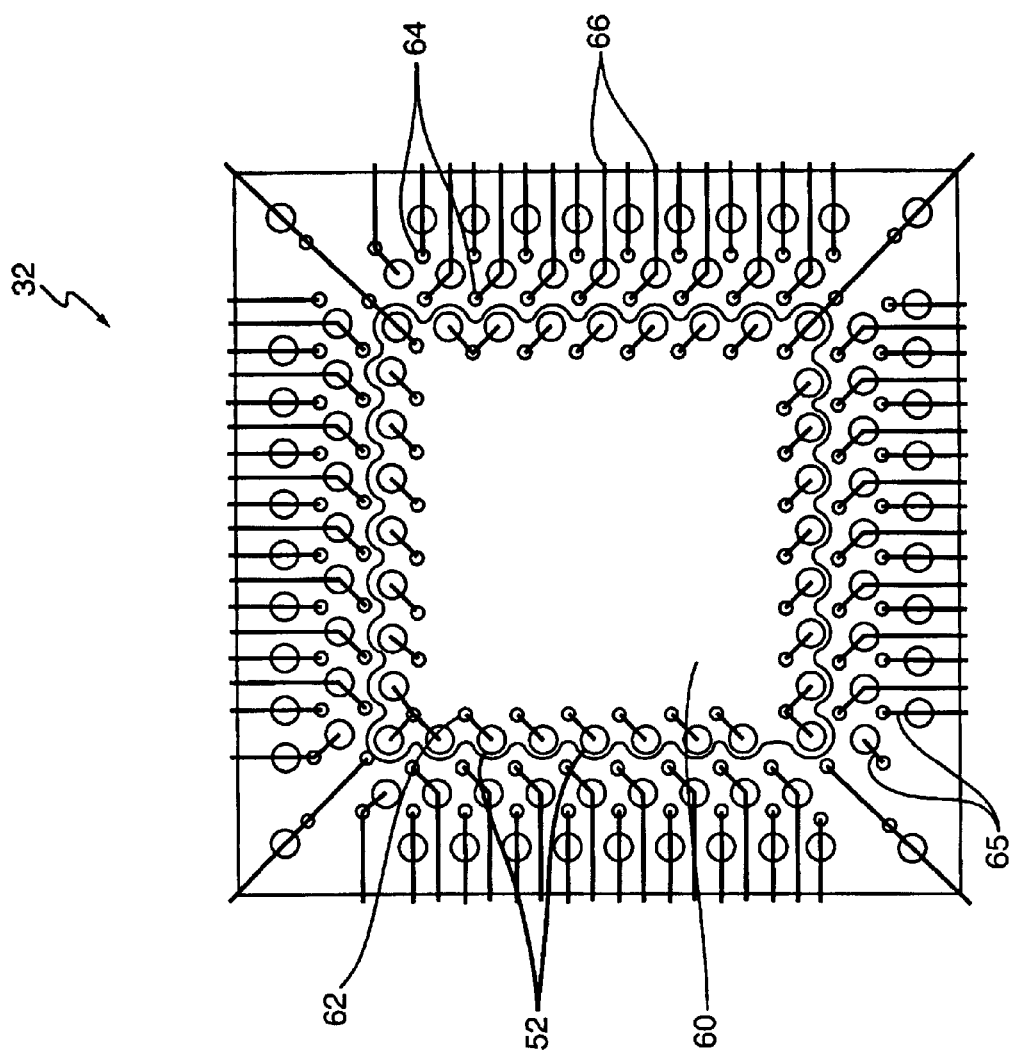
FIG. 3 is a diagram of the bottom metal layer of the carrier shown in FIG. 1.

FIG. 3 illustrates the bottom metal layer 32, which comprises a ground plane 60, ground pads 62 positioned within the ground plane 60, signal pads 64 generally arrayed around the ground plane 60 along the perimeter edges of the carrier 14, and plating bars 66. The plating bars 66 facilitate plating, such as with a tin-lead overlay, of the various metallic features on the bottom side 30 of the carrier 14. All or a portion of the plating bars may be removed subsequent to plating operations.

Note that the thermal vias 52 positioned within the ground plane 60 correspond to those thermal vias 52 shown in FIG. 2. Similarly, the signal vias 48 interspersed among the signal pads 64 correspond to the signal vias 48 shown in the top-side metal layer 28. Conductive traces 65 couple respective signal pads 64 to corresponding signal vias 48.

Each wire bond finger 46 on the top side 26 couples to a corresponding signal via 48, which is in turn coupled with a corresponding one of the signal pads 64 on the bottom side 30. Each signal pad 64 carries a solder ball 22 for attachment with a corresponding connection (not shown) on the primary circuit board 16. Thus, each bond wire connection 18 from the die 12 is electrically coupled to the corresponding primary circuit board connection through the carrier 14. Also, the grounded thermal vias 52 provide electrical and thermal coupling between ground plane 40 on the top side 26 and ground plane 60 on the bottom side 30. As with ground plane 40, ground plane 60 preferably comprises a metallic plane, such as copper foil.

The ground pads 52 positioned within the ground plane 60 each carry a solder ball 22 for attachment to a corresponding ground connection (not shown) on the primary circuit board 16. The interconnected ground planes 40 and 60 and the solder balls 22 attaching the ground pads 62 with the primary circuit board 16 provide low impedance electrical and thermal bonding between the die 12 and the primary circuit board 16. The number of solder ball attachments between the ground plane 60 and the primary circuit board 16 influences the thermal impedance seen by the die 12 with respect to the primary circuit board 16.

Too few ground pads 62 might result in undesirable heat build-up in the die 12, particularly where the die 12 is a high-power device. However, adding ground pads 62 beyond a reasonable number results in only incremental thermal improvements. Something in the range of twenty-eight ground pads 62 providing twenty-eight solder ball connections with the primary circuit board 16 is an exemplary configuration, although more or fewer may be used as needed or desired.

Figure 4:
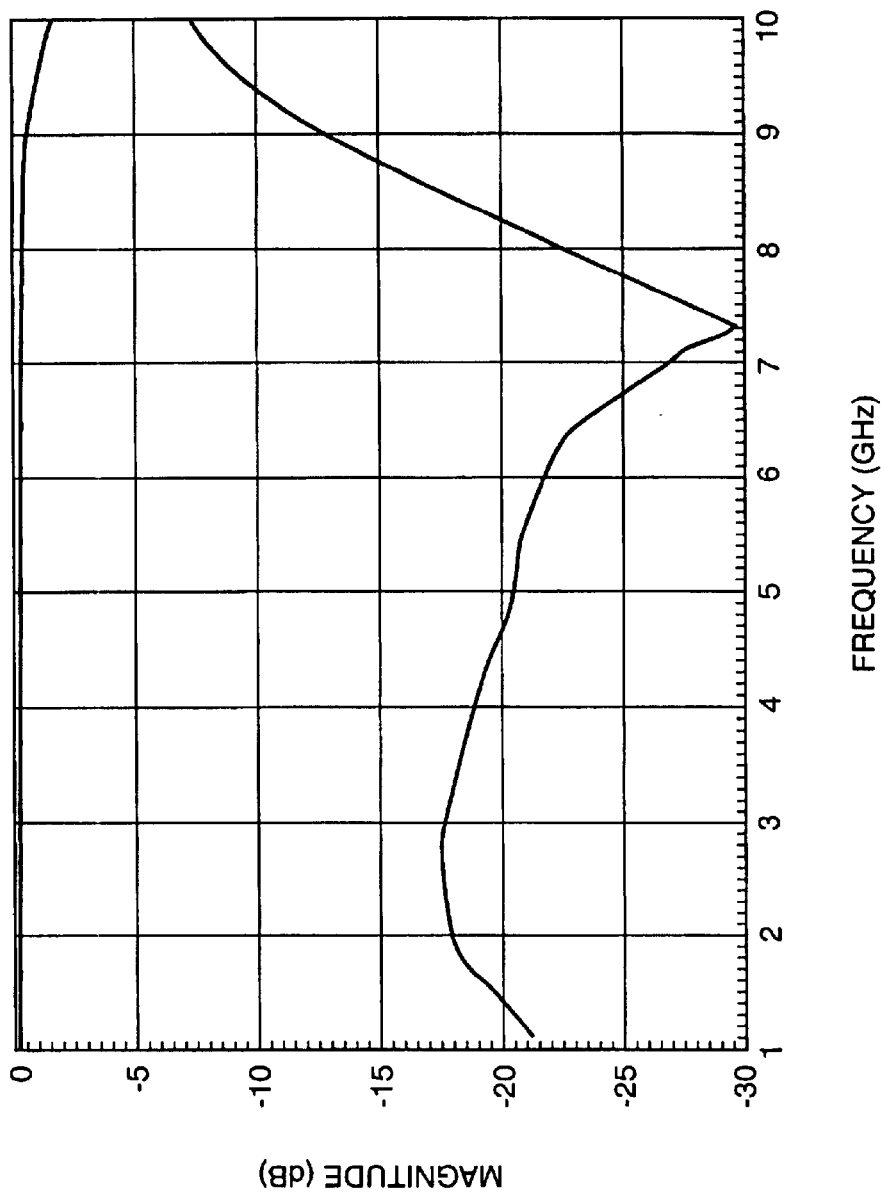
FIG. 4 is a diagram of insertion loss and reflection for an exemplary embodiment of the assembly of FIG. 1.
Figure 5:
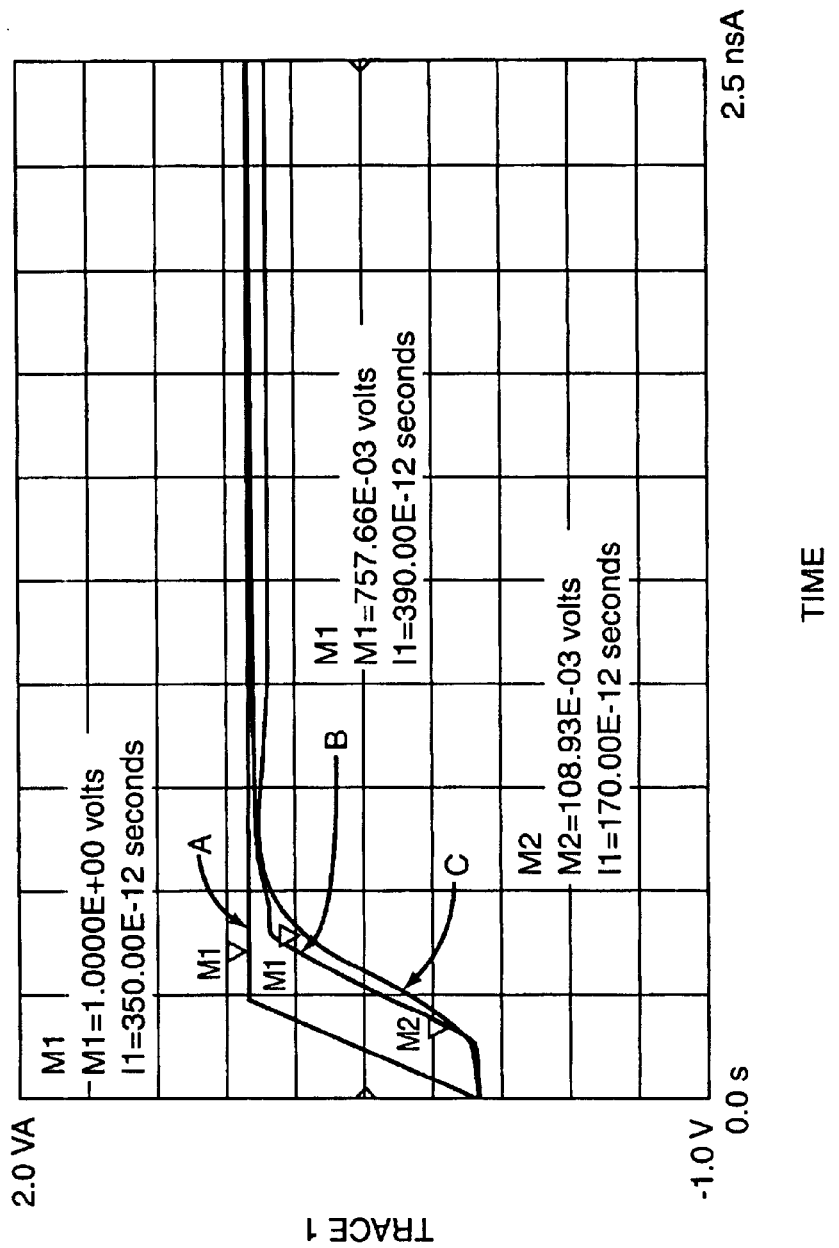
FIG. 5 is a diagram of modeled and measured signal propagation performance for the assembly of FIG. 1.
Figure 6:
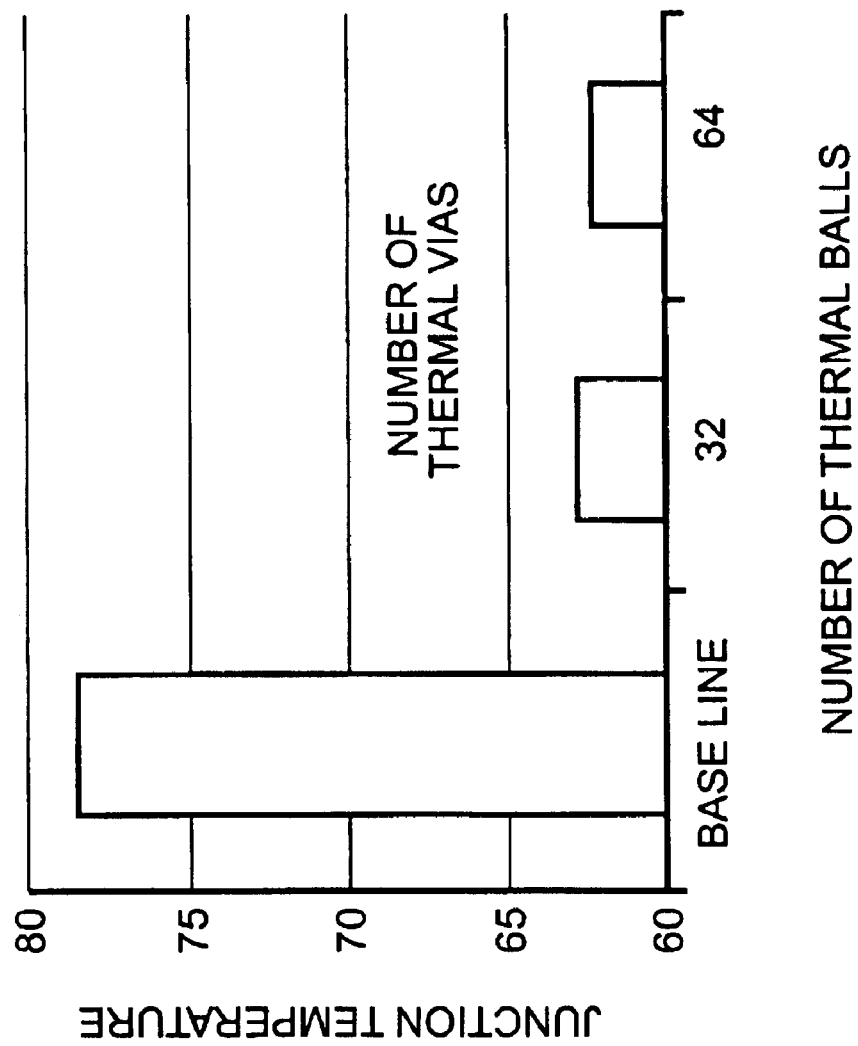
FIG. 6 is a diagram of modeled thermal performance for exemplary variations on the assembly of FIG. 1 as compared to a baseline assembly.

FIGS. 4, 5, and 6 depict various aspects of electrical and thermal performance for an exemplary embodiment of the assembly 10. In this embodiment, the assembly 10 comprises a 7 mm×7 mm square carrier 14 employing twenty-eight bottom-side ground pads 62 coupled to the primary circuit board 16 through corresponding solder balls 22, and thirty-two grounded thermal vias 52 coupling ground planes 40 and 60. The solder balls 22 are implemented with a 0.5 mm pitch (ball-to-ball spacing).

FIG. 4 illustrates the modeled high frequency characteristics of the assembly 10 in terms of insertion loss (upper graph line) and reflection loss (lower graph line), measured in dB and plotted from one to ten GHz. The modeled performance is based on a two-port model, and is taken across an opposing pair of wire bond fingers 46 on the exemplary assembly 10.

FIG. 5 illustrates measured performance in the time domain taken from an assembly 10 built in accordance with the above details. The graph plots voltage against time for output signals edges (B) and (C) with respect to an injected (input) signal edge (A). Graph line (B) depicts the modeled (estimated) response of the assembly 10, while graph line (C) depicts actual, measured response. As may be seen, the actual output signal edge in graph line (C) exhibits little delay and essentially no ringing with regard to the input edge in graph line (A).

FIG. 6 illustrates the thermal performance of the assembly 10 for twenty-eight and sixty-four ground pads 62 (with attached solder balls 22) as compared to a base line package assembly that is similar but lacks ground pads 62, thermal vias 52, and bottom-side ground plane 60. As seen, the thermal impedance of the exemplary package 10 is significantly lower for both the twenty-eight and sixty-four ground pad configurations, with the latter being slightly better than the former. For the same type of die 12 under the same operating conditions, the exemplary assembly 10 reduces die junction temperature by approximately 20° C. The thermal simulation of the package model has been validated with measurements and the designed package can dissipate 2.4 Watts of power under industry-standard test conditions and thermal window.

As discussed above and illustrated in the accompanying drawings, the inventive chip scale package assembly 10 provides enhanced electrical and thermal performance, allowing reliable and sustainable operation of higher-performance dies 12, while maintaining a small package size. The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A chip scale package carrier for electrically connecting an integrated circuit die with ground connections and bond wire signal connections to a primary circuit board, said carrier comprising:
    a plurality of wire bond fingers on a top side of said carrier to receive bond wires attached to respective ones of the signal connections on the die;
    a first plurality of solder ball pads on a bottom side of said carrier electrically coupled to said wire bond fingers on said top side;
    a first etched ground comprising a top layer on said top side of said carrier, said first etched ground plane surrounding said plurality of wire bond fingers and covering a die mounting area on said top side of said carrier;
    a second etched ground plane comprising a bottom layer on said bottom side of said carrier, said second etched ground plane covering a central area of said bottom side of said carrier, with said first plurality of solder ball pads arrayed generally around said second etched ground plane;
    a plurality of thermal vias electrically and thermally coupling said first and second etched ground planes; and
    a second plurality of solder ball pads on said bottom side of said carrier, said second plurality of solder ball pads formed within said etched second ground plane.

2. The chip scale package carrier of claim 1 further comprising a plurality of signal vias electrically coupling said plurality of wire bond fingers and said first plurality of solder ball pads.

3. The chip scale package carrier of claim 2 wherein said plurality of signal vias and said plurality of wire bond fingers comprise combined groups of said wire bond fingers and said signal vias generally distributed around said die mounting area of said top side of said carrier and wherein a central portion of said first etched ground plane covering said die mounting area comprises a hatched ground plane and an outlying portion of said first etched ground plane surrounding said combined groups of wire bond fingers and said signal vias comprises a non-hatched ground plane.

4. The chip scale package carrier of claim 1 further comprising:
    a first set of solder balls, respective ones of said first set of solder balls coupled to respective ones of said first plurality of solder ball pads; and
    a second set of solder balls, respective ones of said second set of solder balls coupled to respective ones of said second plurality of solder ball pads;
    said first and second sets of solder balls operative to attach said chip scale carrier package to the primary circuit board.

5. The chip scale package carrier of claim 1, wherein a portion of said first etched ground plane covering said die mounting area on said top side of said carrier provides one or more ground connections to electrically connect to one or more ground connections on an underside of the die upon mounting the die in said die mounting area of said carrier.

6. The chip scale package carrier of claim 1, wherein said plurality of thermal vias generally are positioned along one or more sides of said second etched ground plane and project through said carrier into said die mounting area of said first etched ground plane.

7. A chip scale package assembly comprising:
    an integrated circuit die having bond wires for electrically interconnecting with said die;
    a carrier for electrically interconnecting said die with a primary circuit board, said carrier comprising:
        a substrate comprising top and bottom sides, said top side comprising a die mounting area to receive said die;
        wire bond fingers on said top side of said substrate to receive said bond wires from said die;
        signal pads on said bottom side of said substrate electrically coupled to said wire bond fingers;
        a first etched ground plane comprising a top layer of said substrate and generally covering said top side of said substrate but leaving exposed said wire bond fingers;
        a second etched ground plane comprising a bottom layer of said substrate and generally covering a central area of said bottom side of said substrate, said signal pads generally arrayed about said second etched ground plane;

ground pads on said bottom side of said substrate, said ground pads positioned within and electrically coupled to said second etched ground plane; and thermal vias positioned within said die mounting area thermally and electrically coupling said first and second etched ground planes.

8. The chip scale package assembly of claim 7 further comprising a plurality of signal vias extending through said substrate to provide said electrical coupling between said wire bond fingers and said signal pads.

9. The chip scale package assembly of claim 8 wherein said wire bond fingers and said plurality of signal vias are arranged in combined groups of wire bond fingers and corresponding signal vias, said combined groups generally positioned along top-side edges of said substrate and wherein a central portion of said first etched ground plane covering said die mounting area comprises a hatched ground plane and an outlying portion of said first etched ground plane surrounding said combined groups of wire bond fingers and said plurality of signal vias.

10. The chip scale package assembly of claim 7 wherein said die further comprises at least one ground connection on an underside of said die to electrically couple with said first etched ground plane covering said die mounting area of said top side of said substrate.

11. The chip scale package assembly of claim 7 further comprising a plurality of solder balls attached to said signal and ground pads on said bottom side of said substrate operative to electrically and thermally couple said die to the primary circuit board.

12. A chip scale package carrier for electrically and thermally coupling an integrated circuit die having bond wire signal connections and at least one ground connection to a primary circuit board, said carrier comprising:

a mounting area on a top side of said carrier to receive the die;

a plurality of wire bond fingers on said top side of said carrier to receive bond wires interconnecting the signal connections on the die with respective ones of said plurality of wire bond fingers;

a plurality of signal pads on a bottom side of said carrier, respective ones of said plurality of said signal pads electrically coupled to respective ones of said wire bond fingers;

a first etched ground plane comprising a top layer of said carrier and generally covering said top side of said carrier, said first etched ground plane leaving said wire bond fingers exposed for interconnection with the bond wires;

a second etched ground plane comprising a bottom layer of said carrier and covering a central area of said bottom side of said carrier, said signal pads on said bottom side generally arrayed around said second etched ground plane;

a plurality of thermal vias positioned within said mounting area and extending through said carrier to electrically and thermally couple said first and second etched ground planes; and a plurality of ground pads on said bottom side of said carrier, said plurality of ground pads positioned within an area defined by said second etched ground plane and electrically coupled to said second etched ground plane.

13. The chip scale package carrier of claim 12 wherein said first etched ground plane comprises a hatched portion substantially covering said die mounting area on said top side of said carrier.

14. The chip scale package carrier of claim 13 wherein said thermal vias are positioned within said first etched ground plane and are generally arrayed around said hatched portion of said first etched ground plane.

15. The chip scale package carrier of claim 12 further comprising an electrical connection between the at least one ground connection of the die and said first etched ground plane, said electrical connection being made between one or more ground connections on an underside of said die brought into contact with said first etched ground plane upon mounting said die on said mounting area.

16. The chip scale package carrier of claim 12 further comprising a plurality of signal vias providing said electrical coupling between said plurality of wire bond fingers and said signal pads.

17. The chip scale package carrier of claim 16 wherein respective ones of said plurality of signal vias correspond to respective ones of said plurality of wire bond fingers, said plurality of wire bond fingers arranged in groups with said corresponding ones of said plurality of signal vias, each one of said groups generally arrayed along a top-side edge of said carrier.

18. The chip scale package carrier of claim 17 wherein said first etched ground plane comprises a continuous metal plane completely surrounding each said group of said wire bond fingers and said corresponding signal vias.

19. The chip scale package carrier of claim 18 wherein a border defined by said first etched ground plane completely surrounding each said group of said wire bond fingers and said corresponding signal vias comprises a contoured border substantially following the contours of each said group.

20. The chip scale package of claim 12 further comprising a plurality of solder balls, respective ones of said solder balls attached to corresponding ones of said signal and ground pads, said plurality of solder ball pads providing for attachment of said carrier to the primary circuit board.

21. A one-piece carrier having a substrate with top and bottom conductive surfaces etched to form topside and bottom side ground planes that are integral with the carrier, said carrier for interconnecting an integrated circuit die with a circuit board and further comprising:

a) plurality of signal points disposed within but isolated from the topside ground plane for interfacing with the signal connections of said integrated circuit die;

b) the plurality of signal points being disposed in groups with each group of signal points being spaced from an adjacent group; and c) a said topside ground plane disposed generally around each of the groups of signal points and extending over a substantial area of a top surface of the substrate, said topside ground plane operative to ground the integrated circuit die by electrically connecting to one or more ground connections on an underside of said die upon said die being mounted on said topside ground plane.

22. The carrier of claim 21 wherein each group of signal points is completely bounded by a perimeter formed by the termination of the topside ground plane.

23. The carrier of claim 22 wherein the topside ground plane includes a central area and wherein the groups of signal points lie outwardly of and around the central area of the topside ground plane.

24. The carrier of claim 23 wherein the carrier assumes a generally rectangular shape having four edges and wherein there is provided four groups of signal points with each group being disposed adjacent one edge of the carrier.

25. The carrier of claim 21 wherein the topside ground plane includes a central portion having a series of openings formed therein.

26. The carrier of claim 25 wherein the central portion of the topside ground plane assumes a hatched configuration.

27. The carrier of claim 21 wherein respective signal points within each group includes a wire bond finger, and wherein respective wire bond fingers are connected to signal vias that extend through the substrate.

28. The carrier of claim 21 further including a series of thermal vias disposed inwardly of the groups of signal points and which are operative to transfer heat from the integrated circuit die through the substrate.

29. The carrier of claim 28 wherein the thermal vias also function as ground vias.

30. The carrier of claim 21 wherein the topside ground plane includes a central mounting area for receiving the integrated circuit die, and wherein the groups of signal points lie outwardly of and around the integrated circuit die when the integrated circuit die is mounted on the carrier.

31. The carrier of claim 21, wherein said carrier further comprises a plurality of thermal vias generally arrayed around one or more sides of said bottom side ground plane, and wherein said plurality of thermal vias project through said carrier into a die mounting area of said topside ground plane and thereby provide thermal and electrical coupling between said topside and bottom side ground planes.

* * * * *